United States Patent
Inazuki et al.

(10) Patent No.: US 10,466,583 B2
(45) Date of Patent: Nov. 5, 2019

(54) HALFTONE PHASE SHIFT MASK BLANK AND HALFTONE PHASE SHIFT MASK

(71) Applicant: SHIN-ETSU CHEMICAL CO., LTD., Tokyo (JP)

(72) Inventors: Yukio Inazuki, Joetsu (JP); Takuro Kosaka, Joetsu (JP); Kouhei Sasamoto, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 134 days.

(21) Appl. No.: 15/717,136

(22) Filed: Sep. 27, 2017

(65) Prior Publication Data
US 2018/0088457 A1 Mar. 29, 2018

(30) Foreign Application Priority Data
Sep. 28, 2016 (JP) ................ 2016-190050

(51) Int. Cl.
G03F 1/00 (2012.01)
G03F 1/32 (2012.01)

(52) U.S. Cl.
CPC ...................... *G03F 1/32* (2013.01)

(58) Field of Classification Search
CPC ........................................ G03F 1/32
USPC .......................................... 430/5
See application file for complete search history.

(56) References Cited

U.S. PATENT DOCUMENTS

| | | | |
|---|---|---|---|
| 5,474,864 A | 12/1995 | Isao et al. | |
| 7,179,545 B2 | 2/2007 | Okazaki et al. | |
| 7,767,366 B2 | 8/2010 | Yoshikawa et al. | |
| 7,771,893 B2 | 8/2010 | Yoshikawa et al. | |
| 7,941,767 B2 | 5/2011 | Mukai et al. | |
| 2005/0244722 A1 | 11/2005 | Okada et al. | |
| 2011/0111332 A1 | 5/2011 | Iwashita et al. | |
| 2013/0071777 A1* | 3/2013 | Nozawa | C23C 14/0036 430/5 |
| 2016/0291452 A1* | 10/2016 | Sasamoto | G03F 1/32 |
| 2016/0377975 A1* | 12/2016 | Matsumoto | G03F 1/32 430/5 |

FOREIGN PATENT DOCUMENTS

| | | |
|---|---|---|
| EP | 3 079 012 A2 | 10/2016 |
| JP | 07-140635 A | 6/1995 |
| JP | 2004-133029 A | 4/2004 |
| JP | 2005-292164 A | 10/2005 |
| JP | 2007-033469 A | 2/2007 |
| JP | 2007-233179 A | 9/2007 |
| JP | 2007-241065 A | 9/2007 |
| JP | 2007-279214 A | 10/2007 |
| JP | 2008-276002 A | 11/2008 |

OTHER PUBLICATIONS

Extended European Search Report dated Mar. 15, 2018, in European Patent Application No. 17192227.1.
Faure et al., "Characterization of Binary and Attenuated Phase Shift Mask Blanks for 32nm Mask Fabrication", Proceedings of SPIE, vol. 7122, pp. 712209-1 to 712209-12.

* cited by examiner

*Primary Examiner* — John A McPherson
(74) *Attorney, Agent, or Firm* — Birch, Stewart, Kolasch & Birch, LLP

(57) ABSTRACT

A halftone phase shift mask blank comprising a transparent substrate and a halftone phase shift film thereon is provided. The halftone phase shift film includes at least one layer composed of a silicon base material having a transition metal content $\leq 3$ at %, a Si+N+O content $\geq 90$ at %, a Si content of 30-70 at %, a N+O content of 30-60 at %, and an O content $\leq 30$ at %, and having a sheet resistance $\leq 10^{13}/\Omega/\square$. The halftone phase shift film undergoes minimal pattern size variation degradation upon exposure to sub-200 nm radiation, and has chemical resistance and improved processability.

15 Claims, 2 Drawing Sheets

HALFTONE PHASE SHIFT MASK BLANK AND HALFTONE PHASE SHIFT MASK

CROSS-REFERENCE TO RELATED APPLICATION

This non-provisional application claims priority under 35 U.S.C. § 119(a) on Patent Application No. 2016-190050 filed in Japan on Sep. 28, 2016, the entire contents of which are hereby incorporated by reference.

TECHNICAL FIELD

This invention relates to a halftone phase shift mask blank and a halftone phase shift mask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift mask. Typically, the halftone phase shift mask includes a substrate of quartz or similar material which is transparent to exposure light, and a mask pattern of halftone phase shift film formed on the substrate, capable of providing a phase shift of approximately 180 degrees and having an insufficient transmittance to contribute to pattern formation. As the halftone phase shift mask, Patent Document 1 (JP-A H07-140635) proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, Patent Document 2 (JP-A 2008-276002) describes that if the photomask is cleaned at a predetermined stage, then it can be continuously used.

As the exposure dose of ArF excimer laser light irradiated for pattern transfer increases, the photomask is given damage different from haze; and the size of the mask pattern changes in accordance with the cumulative irradiation energy dose, as reported in Non-Patent Document 1 (Thomas Faure et al., "Characterization of binary mask and attenuated phase shift mask blanks for 32 nm mask fabrication," Proc. of SPIE, vol. 7122, pp 712209-1 to 712209-12). This problem is that as the cumulative irradiation energy dose increases during long-term irradiation of ArF excimer laser light, a layer of a substance which is considered to be an oxide of the pattern material grows outside the film pattern, whereby the pattern width changes. It is also reported that the mask once damaged cannot be restored by cleaning with AMP (aqueous ammonia/hydrogen peroxide) as used in the above-mentioned haze removal or with SPM (sulfuric acid/hydrogen peroxide). It is believed that the damage source is utterly different.

Non-Patent Document 1 points out that upon exposure of a circuit pattern through a halftone phase shift mask which is the mask technology useful in expanding the depth of focus, substantial degradation is induced by pattern size variation resulting from alteration of a transition metal/silicon base material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

CITATION LIST

Patent Document 1: JP-A H07-140635
Patent Document 2: JP-A 2008-276002 (U.S. Pat. No. 7,941,767)
Patent Document 3: JP-A 2004-133029
Patent Document 4: JP-A 2007-033469
Patent Document 5: JP-A 2007-233179
Patent Document 6: JP-A 2007-241065
Non-Patent Document 1: Thomas Faure et al., "Characterization of binary mask and attenuated phase shift mask blanks for 32 nm mask fabrication," Proc. of SPIE, vol. 7122, pp 712209-1 to 712209-12

SUMMARY OF INVENTION

On use of a photomask blank in the photomask producing process, if foreign deposits are on the photomask blank, they cause defects to the pattern. To remove foreign deposits, the photomask blank is cleaned many times during the photomask producing process. Further, when the photomask thus produced is used in the photolithography process, the photomask is also repeatedly cleaned even if the photomask itself is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or AMP. SPM is a sulfuric acid/hydrogen peroxide mixture which is a cleaning agent having strong oxidizing action. Ozone water is water having ozone dissolved therein and used as a replacement of SPM. AMP is an aqueous ammonia/hydrogen peroxide mixture. When the mask blank or mask having organic foreign deposits on its surface is immersed in the AMP cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage the optical film such as halftone phase shift film on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film (e.g., halftone phase shift film) during every cleaning step.

As pointed out in Non-Patent Document 1, the pattern size variation degradation by irradiation of short wavelength light, typically ArF excimer laser light does scarcely occur when light is irradiated in a dry air atmosphere. Exposure in a dry air atmosphere is regarded as a new approach for inhibiting the pattern size variation degradation. However, the control of a dry air atmosphere adds an extra unit to the exposure system and gives rise to electrostatic and other problems to be managed, leading to an increased expense. Under the circumstances, it is necessary to enable long-term exposure in a common atmosphere that does not need complete removal of humidity (typically having a humidity of around 45%).

The photomasks used in the lithography using ArF excimer laser light as light source include halftone phase shift masks having a halftone phase shift film of a silicon base material containing a transition metal, typically molybdenum. This transition metal/silicon base material is mainly composed of a transition metal and silicon, and further contains oxygen and/or nitrogen as light element (e.g., Patent Document 1). Suitable transition metals used include Mo, Zr, Ta, W, and Ti. Among others, Mo is most often used (e.g., Patent Document 1). Sometimes a second transition metal is added (e.g., Patent Document 3). For the light-shielding film, silicon base materials containing a transition metal, typically molybdenum are also used. However, when a photomask using such transition metal-containing silicon base material is exposed to a large dose of high-energy radiation, the mask undergoes significant pattern size variation degradation by irradiation of high-energy radiation. Then the service lifetime of the photomask is shorter than the requirement.

It is a serious problem that when a photomask pattern on a halftone phase shift mask is irradiated with short-wavelength light, typically ArF excimer laser light, the photomask pattern for exposure experiences a variation of line width, that is, "pattern size variation degradation." The permissible threshold of pattern width differs with the type of photomask pattern, especially the pattern rule applied thereto. If variations are small, the mask may be further used by correcting the exposure conditions and resetting the irradiation conditions of an exposure system. For example, in the lithography for forming semiconductor circuits complying with the pattern rule of 22 nm, the variation of mask pattern line width must fall within approximately ±5 nm. However, if a pattern width variation is large, there is a possibility that the variation has an in-plane distribution on the photomask. Also in the further miniaturization technology, an auxiliary pattern having an ultrafine size of less than 100 nm is formed on the mask. For the purpose of pattern miniaturization on these masks and from the aspect of an increase of mask processing cost by complication of mask pattern, there is a need for a halftone phase shift mask film which experiences minimal pattern size variation degradation and allows for repeated exposure.

Suitable films meeting such requirements include a film of a transition metal-free, silicon base material such as a film consisting of silicon and nitrogen and a film consisting of silicon, nitrogen and oxygen. Although these films are effective for improving chemical resistance and pattern size variation degradation, they suffer from a slow dry etching rate and poor processability.

An object of the invention is to provide a halftone phase shift mask blank and halftone phase shift mask having a halftone phase shift film which upon patternwise exposure using short high-energy radiation of wavelength up to 200 nm, typically ArF excimer laser light, even in the case of an increased cumulative irradiation energy dose, is minimized in pattern size variation degradation resulting from alteration of film property by light irradiation and which is chemically resistant and effectively processable.

Aiming to develop a halftone phase shift film having a minimized pattern size variation degradation upon exposure to ArF excimer laser light and chemical resistance, the inventors made a study on a film consisting of silicon and nitrogen and a film consisting of silicon, nitrogen and oxygen as the halftone phase shift film of transition metal-free silicon base material. Although these halftone phase shift films are dry etchable with fluorine base gas, their processability is poor because of a slow dry etching rate.

Then a study was continued on halftone phase shift films. It has been found that using a silicon base material comprising essentially a transition metal, silicon and nitrogen and optionally oxygen, having a transition metal content of up to 3 at %, a total content of silicon, nitrogen and oxygen of at least 90 at %, a silicon content of 30 to 70 at %, a total content of nitrogen and oxygen of 30 to 60 at %, and an oxygen content of up to 30 at %, there can be formed a halftone phase shift film having equivalent pattern size variation degradation with respect to light of wavelength up to 200 nm and equivalent chemical resistance as compared with transition metal-free silicon base materials, a high etching rate during fluorine gas dry etching, and improved processability over transition metal-free silicon base materials.

Accordingly, in one aspect, the invention provides a halftone phase shift mask blank comprising a transparent substrate and a halftone phase shift film thereon having a phase shift of 150° to 200° and a transmittance of 3% to 30% with respect to light of wavelength up to 200 nm. The halftone phase shift film is a single layer or a multilayer film, and is composed of a silicon base material comprising essentially a transition metal, silicon and nitrogen and optionally oxygen. The halftone phase shift film includes at least one layer (A) composed of a silicon base material having a transition metal content of up to 3 at %, a total content of silicon, nitrogen and oxygen of at least 90 at %, a silicon content of 30 to 70 at %, a total content of nitrogen and oxygen of 30 to 60 at %, and an oxygen content of up to 30 at %, and having a sheet resistance of up to $10^{13}\Omega/\square$.

Typically, the transition metal contains molybdenum.

In a preferred embodiment, the layer (A) is compositionally graded such that the concentration of some or all constituent elements continuously varies in thickness direction.

Typically, the halftone phase shift film has a thickness of up to 70 nm.

In a preferred embodiment, the halftone phase shift film has a surface roughness RMS of up to 0.6 nm.

In a preferred embodiment, the mask blank further includes a second film on the halftone phase shift film, the second film being a single layer or a multilayer film composed of a chromium-containing material. The second film may be a light-shielding film, a combination of light-shielding film and antireflective film, or a processing auxiliary film which functions as a hard mask during pattern formation of the halftone phase shift film.

In a preferred embodiment, the mask blank further includes a third film on the second film, the third film being a single layer or a multilayer film composed of a silicon-containing material. The second film may be a light-shielding film, a combination of light-shielding film and antireflective film, or a processing auxiliary film which functions as a hard mask during pattern formation of the halftone phase shift film, and the third film is a processing auxiliary film which functions as a hard mask during pattern formation of the second film. Also the second film may be a processing auxiliary film which functions as a hard mask during pattern formation of the halftone phase shift film and as an etch stopper during pattern formation of the third film, and the third film is a light-shielding film or a combination of light-shielding film and antireflective film.

In a preferred embodiment, the mask blank further includes a fourth film on the third film, the fourth film being a single layer or a multilayer film composed of a chromium-containing material. Typically, the second film is a processing auxiliary film which functions as a hard mask during pattern formation of the halftone phase shift film and as an etch stopper during pattern formation of the third film, the third film is a light-shielding film or a combination of light-shielding film and antireflective film, and the fourth film is a processing auxiliary film which functions as a hard mask during pattern formation of the third film.

Also contemplated herein is a halftone phase shift mask prepared from the halftone phase shift mask blank defined above.

Advantageous Effects of Invention

The halftone phase shift mask blank of the invention has a halftone phase shift film which experiences minimal pattern size variation degradation with respect to light of wavelength up to 200 nm, has good chemical resistance, and is improved in processability over transition metal-free silicon base material films. The inventive halftone phase shift film is improved in processability over transition metal-free silicon base material films as demonstrated by a higher etching rate during fluorine base dry etching than transition metal-free silicon base material films, while it maintains substantially equivalent laser irradiation resistance and chemical resistance to transition metal-free silicon base material films. In addition, the inventive halftone phase shift film has a low sheet resistance enough to suppress any charge buildup.

DESCRIPTION OF PREFERRED EMBODIMENTS

The invention pertains to a halftone phase shift mask blank (or halftone phase shift type photomask blank) comprising a transparent substrate and a halftone phase shift film formed thereon. The transparent substrate is typically a quartz substrate. Preference is given to transparent substrates of 6 inch squares and 25 mil thick, known as 6025 substrate, as prescribed in the SEMI standards, or transparent substrates of 152 mm squares and 6.35 mm thick when expressed in the SI units. The halftone phase shift film may be a single layer structure or a multilayer structure (i.e., two or more layers). The invention also pertains to a halftone phase shift (photo)mask having a (photo)mask pattern of a halftone phase shift film.

Figure 1A:
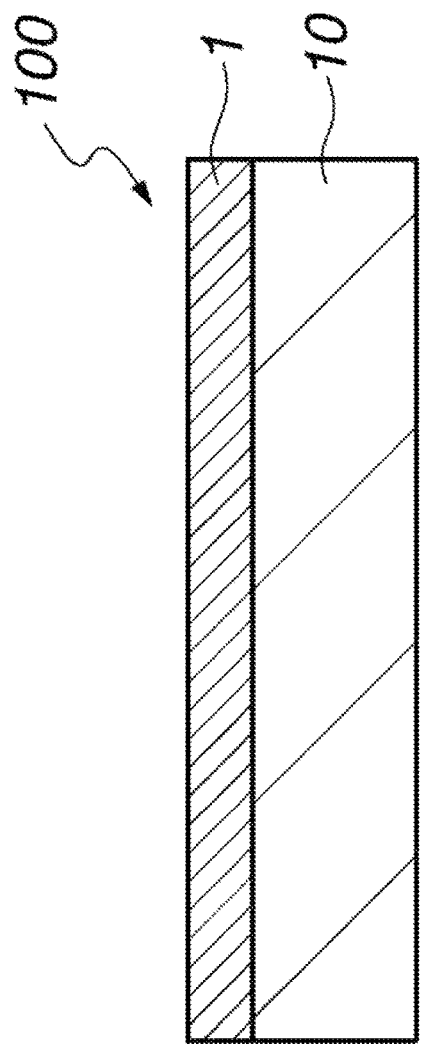
FIGS. 1A and 1B are cross-sectional views of one exemplary halftone phase shift mask blank and halftone phase shift mask of the invention, respectively.
Figure 1B:
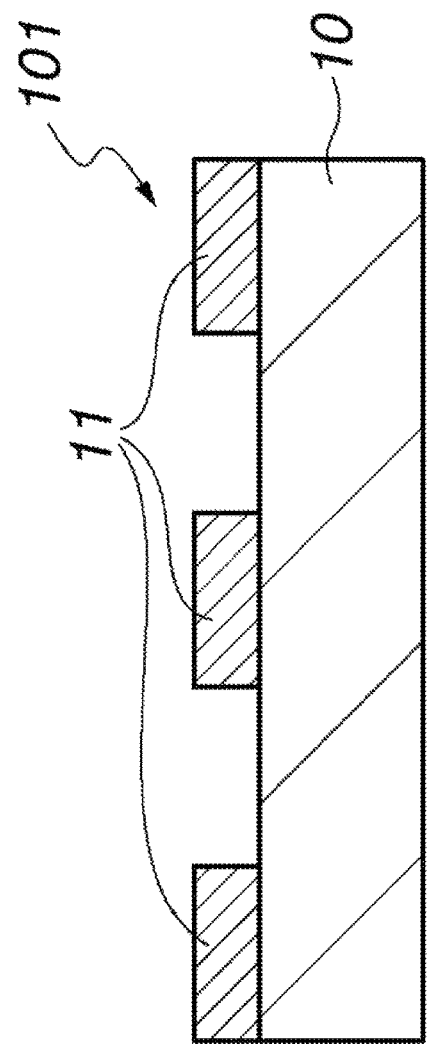

FIG. 1A is a cross-sectional view of a halftone phase shift mask blank in one embodiment of the invention. The halftone phase shift mask blank 100 includes a transparent substrate 10 and a halftone phase shift film 1 formed thereon. FIG. 1B is a cross-sectional view of a halftone phase shift mask in one embodiment of the invention. The halftone phase shift mask 101 includes a transparent substrate 10 and a halftone phase shift film pattern 11 thereon.

The halftone phase shift film may be composed of a single layer or multiple layers as long as a phase shift and a transmittance necessary for the halftone phase shift function are met. In the case of multilayer structure, the film is preferably composed of multiple layers including an antireflective function layer so that the overall film may meet a predetermined surface reflectance as well as the necessary phase shift and transmittance.

In either of the single layer and multilayer structure, each layer may be a compositionally graded layer, i.e., a layer wherein the concentration of some or all constituent elements varies continuously in thickness direction. In particular, the layer (A) of the predetermined composition to be described later should preferably be a layer wherein the concentration of some or all constituent elements varies continuously in thickness direction. In the case of multilayer structure, the halftone phase shift film may be a combination of two or more layers selected from layers composed of different constituents and layers composed of identical constituents in different compositional ratios. Where the film is composed of three or more layers, identical layers may be included as long as they are not contiguous to each other.

Since halftone phase shift masks are used in the photolithography using exposure light of wavelength up to 200 nm, typically ArF excimer laser light (wavelength 193 nm), the halftone phase shift film should provide a predetermined phase shift and a predetermined transmittance with respect to the exposure light at a predetermined thickness.

The overall thickness of the halftone phase shift film should preferably be up to 70 nm, and more preferably up to 65 nm, because a thinner film facilitates to form a finer pattern. The lower limit of the film thickness is set in the range where the desired optical properties are obtained relative to light of wavelength up to 200 nm. Specifically, the film thickness is set at least 40 nm, though the lower limit is not critical.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is 150 to 200 degrees. Although ordinary halftone phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°. Also the halftone phase shift film has a transmittance of exposure light of at least 3%, preferably at least 5%, and up to 30%.

Preferably the halftone phase shift film has a surface roughness (RMS) of up to 0.6 nm. The surface roughness (RMS) used herein is a surface roughness (RMS) as measured by an atomic force microscope (AFM). A smaller value of surface roughness is preferred in that smaller defects are detectable upon defect inspection. Also preferably the halftone phase shift film has a sheet resistance of up to $10^{13}$ ohm/squares ($\Omega/\square$), especially up to $10^{12}\Omega/\square$. In particular, the layer (A) to be described below should have a sheet resistance of up to $10^{15}\Omega/\square$, especially up to $10^{13}\Omega/\square$. As long as the sheet resistance of the halftone phase shift film falls in the range, any charge buildup, for example, charge buildup during the measurement of mask pattern size under electron microscope, typically scanning electron microscope (SEM) can be suppressed, enabling more accurate size measurement.

While the halftone phase shift film has a phase shift, transmittance and thickness in the above-defined ranges, it preferably has a refractive index n of at least 2.4, more preferably at least 2.5, and even more preferably at least 2.6 with respect to exposure light. By reducing the oxygen content of the halftone phase shift film, preferably by eliminating oxygen, the refractive index n of the film can be increased, and the thickness of the film can be reduced while maintaining the necessary phase shift for the phase shift function. The refractive index n is higher as the oxygen content is lower, and in turn, the necessary phase shift is available from a thinner film as the refractive index n is higher. Therefore, when the halftone phase shift film is a single layer structure, this single layer preferably has a refractive index n of at least 2.4, more preferably at least 2.5, and even more preferably at least 2.6. When the halftone phase shift film is a multilayer structure, a portion thereof corresponding to at least 60%, preferably at least 70%, more preferably at least 80%, further preferably at least 90%, most preferably 100% of the overall thickness preferably has a refractive index n of at least 2.4, more preferably at least 2.5, and even more preferably at least 2.6.

While the halftone phase shift film has a phase shift, transmittance and thickness in the above-defined ranges, it preferably has an extinction coefficient k of at least 0.4, especially at least 0.6 and up to 0.7, especially up to 0.65 with respect to exposure light. When the halftone phase shift film is a single layer structure, this single layer preferably has an extinction coefficient k of at least 0.4, especially at least 0.6 and up to 0.7, especially up to 0.65. When the halftone phase shift film is a multilayer structure, a portion thereof corresponding to at least 60%, preferably at least 70%, more preferably at least 80%, further preferably at least 90%, most preferably 100% of the overall thickness preferably has an extinction coefficient k of at least 0.1, especially at least 0.2 and up to 0.7, especially up to 0.65.

The halftone phase shift film is composed of a silicon base material comprising essentially a transition metal, silicon and nitrogen and optionally oxygen. The single layer or each of multiple layers by which the halftone phase shift film is constructed is composed of a silicon base material comprising essentially a transition metal, silicon and nitrogen and optionally oxygen. Inclusion of other elements is acceptable as long as they are in impurity amounts. The halftone phase shift film includes at least one layer (A) of the predetermined composition. When the halftone phase shift film is a single layer, the overall single layer is layer (A) of the predetermined composition; or when the film is a multilayer film, a portion thereof corresponding to at least 50%, preferably at least 60%, more preferably at least 70% of the overall thickness (excluding a surface oxidized layer if any) is preferably layer (A) of the predetermined composition. In the preferred embodiment, layer (A) accounts for at least 80%, more preferably at least 90%, and most preferably 100% of the overall thickness. When the halftone phase shift film is a multilayer film, preferably the outermost surface layer of the film which is disposed remote from the transparent substrate is layer (A).

In the halftone phase shift film, the silicon base material of which layer (A) is composed should have a transition metal content of up to 3 at %, preferably up to 2 at %, more preferably up to 1.5 at % and preferably at least 0.1 at %, more preferably at least 0.5 at %, even more preferably at least 1 at %. In view of the sheet resistance of the halftone phase shift film, the content of transition metal is preferably at least 0.1 at %, more preferably at least 0.5 at %, even more preferably at least 1 at %. For obtaining a satisfactory sheet resistance, the content of transition metal is more preferably more than 1 at %, especially at least 1.1 at %. Suitable transition metals include molybdenum, zirconium, tungsten, titanium, hafnium, chromium and tantalum. Preferably, molybdenum is contained. Most preferably the transition metal is molybdenum.

In the halftone phase shift film, the silicon base material of which layer (A) is composed should have a total content of silicon, nitrogen and oxygen (a total content of silicon and nitrogen if oxygen-free) of at least 90 at %, preferably at least 95 at %.

In the halftone phase shift film, the silicon base material of which layer (A) is composed should have a silicon content of at least 30 at %, preferably at least 40 at %, and up to 70 at %, preferably up to 55 at %. A portion having a silicon content of up to 50 at % should preferably account for at least 10% of the overall thickness of layer (A). Where the halftone phase shift film has a low transmittance (e.g., from 3% to less than 20%, specifically from 3% to 12%, more specifically from 3% to less than 10%), the silicon base material preferably has a silicon content of at least 40 at %, preferably at least 44 at %, and up to 70 at %, preferably up to 55 at %; and a portion having a silicon content of up to 50 at % should preferably account for at least 10% of the overall thickness of layer (A). Where the halftone phase shift film has a high transmittance (e.g., from 20% to 30%), the silicon base material preferably has a silicon content of at least 30 at %, preferably at least 40 at %, and up to 55 at %, preferably up to 50 at %; and a portion having a silicon content of up to 45 at % should preferably account for at least 10% of the overall thickness of layer (A).

In the halftone phase shift film, the silicon base material of which layer (A) is composed should have a total content of nitrogen and oxygen of at least 30 at %, preferably at least 45 at % and up to 60 at %, preferably up to 55 at %. A portion having a total content of nitrogen and oxygen of at least 50 at % should preferably account for at least 10% of the overall thickness of layer (A).

In the halftone phase shift film, the silicon base material of which layer (A) is composed should preferably have a nitrogen content of at least 10 at %, more preferably at least 40 at % and up to 60 at %, more preferably up to 55 at %. Where the halftone phase shift film has a low transmittance (e.g., from 3% to less than 20%, specifically from 3% to 12%, more specifically from 3% to less than 10%), the silicon base material preferably has a nitrogen content of at least 40 at %, preferably at least 44 at %, and up to 60 at %, preferably up to 56 at %; and a portion having a nitrogen content of at least 48 at %, especially at least 50 at % should preferably account for at least 10% of the overall thickness of layer (A). Where the halftone phase shift film has a high transmittance (e.g., from 20% to 30%), the silicon base material preferably has a nitrogen content of at least 10 at %, preferably at least 40 at %, and up to 60 at %, preferably up to 55 at %.

In the halftone phase shift film, the silicon base material of which layer (A) is composed should have an oxygen content of up to 30 at %, more preferably up to 6 at %. Where the halftone phase shift film has a high transmittance (e.g., from 20% to 30%), the silicon base material preferably has an oxygen content of up to 30 at %, preferably up to 25 at %. Where the halftone phase shift film has a low transmittance (e.g., from 3% to less than 20%, specifically from 3% to 12%, more specifically from 3% to less than 10%), the silicon base material preferably has an oxygen content of up to 6 at %, more preferably up to 3.5 at %, even more preferably up to 1 at %.

Suitable silicon base materials include transition metal silicon base materials, specifically a transition metal silicon base material consisting of a transition metal (Me), silicon and nitrogen, i.e., transition metal silicon nitride (MeSiN) and a transition metal silicon base material consisting of a transition metal (Me), silicon, nitrogen and oxygen, i.e., transition metal silicon oxynitride (MeSiON).

In order to form the halftone phase shift film as a thin film, a silicon base material with a lower oxygen content is preferred, with an oxygen-free material being more preferred. From this aspect, the halftone phase shift film should preferably be composed of an oxygen-free silicon base material.

On fluorine base dry etching, the halftone phase shift film preferably has a higher etching rate than the transparent substrate. The halftone phase shift film is further improved in processability when a ratio of the etching rate of the film to the etching rate of the substrate is preferably at least 1.25, more preferably at least 1.3, even more preferably at least 1.35.

While the halftone phase shift film may be deposited by any well-known film-forming techniques, the sputtering technique is preferred because films of homogeneity are readily deposited. Either DC sputtering or RF sputtering may be employed. The target and sputtering gas may be selected as appropriate depending on the layer construction and composition of the film. Suitable targets include a silicon target, a silicon nitride target, and a target containing silicon and silicon nitride, which may contain a transition metal. The contents of nitrogen and oxygen may be adjusted during reactive sputtering by using nitrogen-containing gas, oxygen-containing gas, or nitrogen/oxygen-containing gas, and optionally carbon-containing gas, as the reactive gas, and adjusting the flow rate thereof. The reactive gas is, for example, nitrogen gas ($N_2$ gas), oxygen gas ($O_2$ gas), or nitrogen oxide gases ($N_2O$ gas, NO gas, $NO_2$ gas). A rare gas such as helium, neon or argon gas may be used as the sputtering gas.

In the embodiment wherein the halftone phase shift film is a multilayer film, the film may include a surface oxidized layer as the outermost layer on the surface side (disposed remote from the substrate) in order to suppress any alteration in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, and heating of a film at 300° C. or higher in an oxygen-containing atmosphere, typically oxygen gas atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment as mentioned above is preferred for forming a less defective layer.

In the halftone phase shift mask blank of the invention, a second film of single layer or multilayer structure may be formed on the halftone phase shift film. Most often, the second film is disposed contiguous to the halftone phase shift film. Examples of the second film include a light-shielding film, a combination of light-shielding film and antireflective film, and a processing auxiliary film which functions as a hard mask during subsequent pattern formation of the halftone phase shift film. When a third film is formed as will be described later, the second film may be utilized as a processing auxiliary film (etching stop film) which functions as an etching stopper during subsequent pattern formation of the third film. The second film is preferably composed of a chromium-containing material.

Figure 2A:
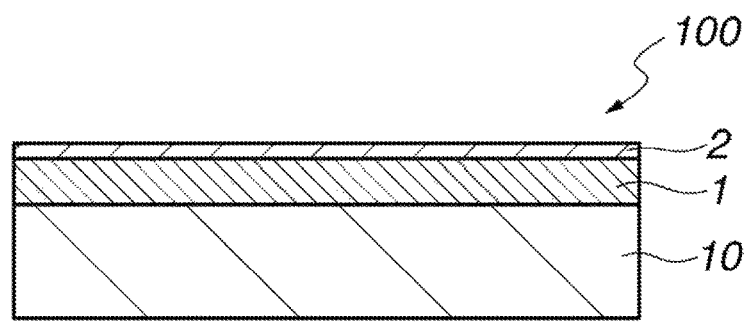
FIGS. 2A, 2B and 2C are cross-sectional views of further embodiments of the halftone phase shift mask blank of the invention.

One exemplary embodiment is a halftone phase shift mask blank illustrated in FIG. 2A. The halftone phase shift mask blank depicted at 100 in FIG. 2A includes a transparent substrate 10, a halftone phase shift film 1 formed on the substrate, and a second film 2 formed on the film 1.

The halftone phase shift mask blank may include a light-shielding film as the second film on the halftone phase shift film. A combination of a light-shielding film and an antireflective film may also be used as the second film. The provision of the second film including a light-shielding film ensures that a halftone phase shift mask includes a region capable of completely shielding exposure light. The light-shielding film and antireflective film may also be utilized as a processing auxiliary film during etching. The construction and material of the light-shielding film and antireflective film are known from many patent documents, for example, Patent Document 4 (JP-A 2007-033469) and Patent Document 5 (JP-A 2007-233179). One preferred film construction of the light-shielding film and antireflective film is a structure having a light-shielding film of Cr-containing material and an antireflective film of Cr-containing material for reducing reflection by the light-shielding film. Each of the light-shielding film and the antireflective film may be a single layer or multilayer. Suitable Cr-containing materials of which the light-shielding film and antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a light-shielding film or a combination of a light-shielding film and an antireflective film, the light-shielding film is made of a chromium base material having a chromium content of at least 40 at %, especially at least 60 at % and less than 100 at %, preferably up to 99 at %, and more preferably up to 90 at %. The chromium base material has an oxygen content of at least 0 at % and up to 60 at %, preferably up to 40 at %, with an oxygen content of at least 1 at % being preferred when an etching rate must be adjusted. The chromium base material has a nitrogen content of at least 0 at % and up to 50 at %, preferably up to 40 at %, with a nitrogen content of at least 1 at % being preferred when an etching rate must be adjusted. The chromium base material has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a combination of a light-shielding film and an antireflective film, the antireflective film is preferably made of a chromium-containing material having a chromium content of preferably at least 30 at %, more preferably at least 35 at % and preferably up to 70 at %, and more preferably up to 50 at %. The chromium-containing material preferably has an oxygen content of up to 60 at %, and at least 1 at % and more preferably at least 20 at %. The chromium-containing material preferably has a nitrogen content of up to 50 at %, more preferably up to 30 at %, and at least 1 at %, more preferably at least 3 at %. The chromium-containing material preferably has a carbon content of at least 0 at % and up to 20 at %, more preferably up to 5 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a processing auxiliary film (etching mask film) which functions as a hard mask during pattern formation of the halftone phase shift film, the processing auxiliary film is preferably composed of a material having different etching properties from the halftone phase shift film, for example, a material having resistance to fluorine dry etching applied to the etching of silicon-containing material, specifically a chromium-containing material which can be etched with oxygen-containing chlorine gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a processing auxiliary film, the film preferably has a chromium content of preferably at least 40 at %, more preferably at least 50 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a light-shielding film or a combination of a light-shielding film and an antireflective film, the second film has a thickness of typically 20 to 100 nm, preferably 40 to 70 nm. Also the halftone phase shift film combined with the second film should preferably have a total optical density of at least 2.0, more preferably at least 2.5, and even more preferably at least 3.0, with respect to exposure light of wavelength up to 200 nm. Where the second film is a processing auxiliary film, the second film has a thickness of typically 1 to 100 nm, preferably 2 to 50 nm.

In the halftone phase shift mask blank of the invention, a third film of single layer or multilayer structure may be formed on the second film. Most often, the third film is disposed contiguous to the second film. Examples of the third film include a light-shielding film, a combination of light-shielding film and antireflective film, and a processing auxiliary film which functions as a hard mask during subsequent pattern formation of the second film. The third film is preferably composed of a silicon-containing material, especially chromium-free silicon-containing material.

Figure 2B:
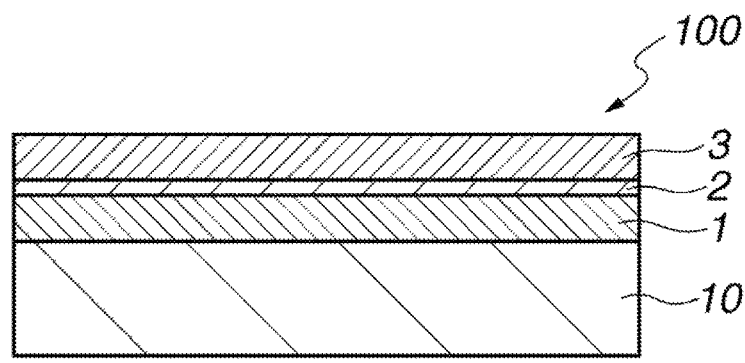

One exemplary embodiment is a halftone phase shift mask blank illustrated in FIG. 2B. The halftone phase shift mask blank depicted at 100 in FIG. 2B includes a transparent substrate 10, a halftone phase shift film 1 formed on the substrate, a second film 2 formed on the film 1, and a third film 3 formed on the second film 2.

Where the second film is a light-shielding film, a combination of a light-shielding film and an antireflective film or a processing auxiliary film which functions as a hard mask during subsequent pattern formation of the halftone phase shift film, the third film may be a processing auxiliary film (etching mask film) which functions as a hard mask during subsequent pattern formation of the second film. When a fourth film is formed as will be described later, the third film may be utilized as a processing auxiliary film (etching stop film) which functions as an etching stopper during subsequent pattern formation of the fourth film. The processing auxiliary film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is a processing auxiliary film, it is preferably composed of a silicon-containing material having a silicon content of preferably at least 20 at %, more preferably at least 33 at % and up to 95 at %, more preferably up to 80 at %. The silicon-containing material has a nitrogen content of at least 0 at % and up to 50 at %, preferably up to 30 at %, with a nitrogen content of at least 1 at % being preferred when an etching rate must be adjusted. The silicon-containing material has an oxygen content of at least 0 at %, preferably at least 20 at % and up to 70 at %, preferably up to 66 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a light-shielding film or a combination of a light-shielding film and an antireflective film and the third film is a processing auxiliary film, the second film has a thickness of typically 20 to 100 nm, preferably 40 to 70 nm, and the third film has a thickness of typically 1 to 30 nm, preferably 2 to 15 nm. Also the halftone phase shift film combined with the second film should preferably have a total optical density of at least 2.0, more preferably at least 2.5, and even more preferably at least 3.0, with respect to exposure light of wavelength up to 200 nm. Where the second film is a processing auxiliary film and the third film is a processing auxiliary film, the second film has a thickness of typically 1 to 100 nm, preferably 2 to 50 nm, and the third film has a thickness of typically 1 to 30 nm, preferably 2 to 15 nm.

Where the second film is a processing auxiliary film, a light-shielding film may be formed as the third film. Also, a combination of a light-shielding film and an antireflective film may be formed as the third film. Herein the second film may be utilized as a processing auxiliary film (etching mask film) which functions as a hard mask during pattern formation of the halftone phase shift film, or a processing auxiliary film (etching stop film) which functions as an etching stopper during pattern formation of the third film. Examples of the processing auxiliary film are films of chromium-containing materials as described in Patent Document 6 (JP-A 2007-241065). The processing auxiliary film may be a single layer or multilayer. Suitable chromium-containing materials of which the processing auxiliary film is made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a processing auxiliary film, the film preferably has a chromium content of preferably at least 40 at %, more preferably at least 50 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

On the other hand, the light-shielding film and antireflective film as the third film are preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and nitrogen and/or oxygen, a material containing silicon and a transition metal, and a material containing silicon, nitrogen and/or oxygen, and a transition metal. Exemplary of the transition metal are molybdenum, tantalum and zirconium.

Where the third film is a light-shielding film or a combination of a light-shielding film and an antireflective film, the light-shielding film and antireflective film are preferably composed of a silicon-containing material having a silicon content of preferably at least 10 at %, more preferably at least 30 at % and less than 100 at %, more preferably up to 95 at %. The silicon-containing material has a nitrogen content of at least 0 at % and up to 50 at %, preferably up to 40 at %, especially up to 20 at %, with a nitrogen content of at least 1 at % being preferred when an etching rate must be adjusted. The silicon-containing material has an oxygen content of at least 0 at %, and up to 60 at %, preferably up to 30 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a processing auxiliary film and the third film is a light-shielding film or a combination of a light-shielding film and an antireflective film, the second film has a thickness of typically 1 to 20 nm, preferably 2 to 10 nm, and the third film has a thickness of typically 20 to 100 nm, preferably 30 to 70 nm. Also the halftone phase shift film combined with the second and third films should preferably have a total optical density of at least 2.0, more preferably at least 2.5, and even more preferably at least 3.0, with respect to exposure light of wavelength up to 200 nm.

In the halftone phase shift photomask blank of the invention, a fourth film of single layer or multilayer structure may be formed on the third film. Most often, the fourth film is disposed contiguous to the third film. Exemplary of the fourth film is a processing auxiliary film which functions as a hard mask during subsequent pattern formation of the third film. The fourth film is preferably composed of a chromium-containing material.

Figure 2C:
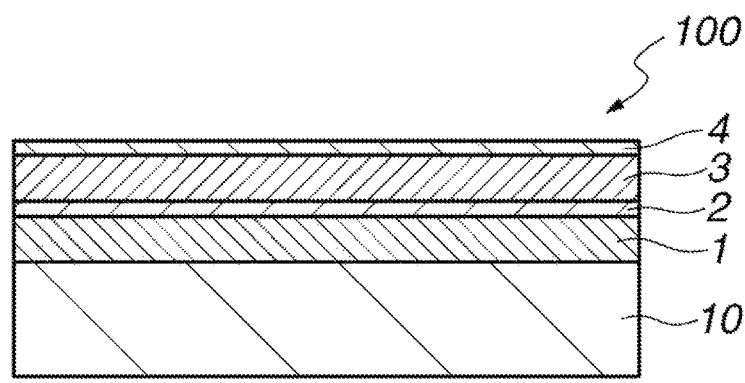

One exemplary embodiment is a halftone phase shift mask blank illustrated in FIG. 2C. The halftone phase shift mask blank depicted at 100 in FIG. 2C includes a transparent substrate 10, a halftone phase shift film 1 formed on the substrate, a second film 2 formed on the film 1, a third film 3 formed on the second film 2, and a fourth film 4 formed on the third film 3.

Where the third film is a light-shielding film or a combination of a light-shielding film and an antireflective film, the fourth film may be a processing auxiliary film (etching mask film) which functions as a hard mask during subsequent pattern formation of the third film. The processing auxiliary film is preferably composed of a material having different etching properties from the third film, for example, a material having resistance to fluorine dry etching applied to the etching of silicon-containing material, specifically a chromium-containing material which can be etched with oxygen-containing chloride gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the fourth film is a processing auxiliary film, the film has a chromium content of at least 40 at %, preferably at least 50 at % and up to 100 at %, preferably up to 99 at %, and more preferably up to 90 at %. The film has an oxygen content of at least 0 at % and up to 60 at %, preferably up to 40 at %, with an oxygen content of at least 1 at % being preferred when an etching rate must be adjusted. The film has a nitrogen content of at least 0 at % and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a processing auxiliary film, the third film is a light-shielding film or a combination of a light-shielding film and an antireflective film, and the fourth film is a processing auxiliary film; the second film has a thickness of typically 1 to 20 nm, preferably 2 to 10 nm, the third film has a thickness of typically 20 to 100 nm, preferably 30 to 70 nm, and the fourth film has a thickness of typically 1 to 30 nm, preferably 2 to 20 nm. Also the halftone phase shift film combined with the second and third films should preferably have a total optical density of at least 2.0, more preferably at least 2.5, and even more preferably at least 3.0, with respect to exposure light of wavelength up to 700 nm.

The second and fourth films of chromium-containing materials may be deposited by reactive sputtering using a chromium target or a chromium target having one or more of oxygen, nitrogen and carbon added thereto, and a sputtering gas based on a rare gas such as Ar, He or Ne, to which a reactive gas selected from oxygen-containing gas, nitrogen-containing gas and carbon-containing gas is added depending on the desired composition of a film to be deposited.

The third film of silicon-containing material may be deposited by reactive sputtering using a silicon target, silicon nitride target, target containing silicon and silicon nitride, transition metal target, or composite silicon/transition metal target, and a sputtering gas based on a rare gas such as Ar, He or Ne, to which a reactive gas selected from oxygen-containing gas, nitrogen-containing gas and carbon-containing gas is added depending on the desired composition of a film to be deposited.

The mask blank may be processed into a mask by a standard technique. For example, a halftone phase shift mask blank comprising a halftone phase shift film and a second film of chromium-containing material deposited thereon may be processed as follows. First, a resist film adapted for electron beam (EB) lithography is formed on the second film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the second film, obtaining a pattern of the second film. Next, while the second film pattern is used as etching mask, fluorine base dry etching is carried out for transferring the pattern to the halftone phase shift film, obtaining a pattern of the halftone phase shift film. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In another example, a halftone phase shift mask blank comprising a halftone phase shift film, a light-shielding film or a light-shielding film/antireflective film of chromium-containing material deposited thereon as a second film, and a processing auxiliary film of silicon-containing material deposited thereon as a third film may be processed as follows. First, a resist film adapted for EB lithography is formed on the third film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, obtaining a pattern of the second film. The resist pattern is removed at this point. Further, while the second film pattern is used as etching mask, fluorine base dry etching is carried out for transferring the second film pattern to the halftone phase shift film to define a pattern of the halftone phase shift film and at the same time, removing the third film pattern. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In a further example, a halftone phase shift mask blank comprising a halftone phase shift film, a processing auxiliary film of chromium-containing material deposited thereon as a second film, and a light-shielding film or a light-shielding film/antireflective film of silicon-containing material deposited on the second film as a third film may be processed as follows. First, a resist film adapted for EB lithography is formed on the third film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, whereby a pattern of the second film is obtained, that is, a portion of the second film where the halftone phase shift film is to be removed is removed. The resist pattern is removed at this point. A resist pattern for protecting a portion of the third film to be left is formed on the third film. Further, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed, yielding a halftone phase shift mask.

In a still further example, a halftone phase shift mask blank comprising a halftone phase shift film, a processing auxiliary film of chromium-containing material deposited thereon as a second film, a light-shielding film or a light-shielding film/antireflective film of silicon-containing material deposited on the second film as a third film, and a processing auxiliary film of chromium-containing material deposited on the third film as a fourth film may be processed as follows. First, a resist film adapted for EB lithography is formed on the fourth film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the fourth film, obtaining a pattern of the fourth film. While the fourth film pattern thus obtained is used as etching mask, fluorine base dry etching is carried out for transferring the fourth film pattern to the third film, obtaining a pattern of the third film. The resist pattern is removed at this point. A resist pattern for protecting a portion of the third film to be left is formed on the fourth film. Further, while the third film pattern is used as etching mask, oxygen-containing chlorine base dry etching is carried out for transferring the third film pattern to the second film, obtaining a pattern of the second film and at the same time, removing the portion of the fourth film which is not protected with the resist pattern. Next, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed and the portion of the fourth film where the resist pattern has been removed, yielding a halftone phase shift mask.

In a photolithographic method for forming a pattern with a half pitch of up to 50 nm, typically up to 30 nm, and more typically up to 20 nm on a processable substrate, comprising the steps of forming a photoresist film on the processable substrate and exposing the photoresist film to light of wavelength up to 200 nm, typically ArF excimer laser (193 nm) or $F_2$ laser (157 nm), through a patterned mask for transferring the pattern to the photoresist film, the halftone phase shift mask of the invention is best suited for use in the exposure step.

EXAMPLE

Examples are given below for further illustrating the invention although the invention is not limited thereto.

Example 1

A DC magnetron sputtering system capable of simultaneously inducing electric discharge to two targets was loaded with a MoSi target and a Si target. A quartz substrate of 152 mm squares and 6.35 mm thick was set in the chamber. Sputtering was carried out by applying a power of 35 W across the MoSi target and a power of 1,900 W across the Si target for simultaneous discharge, feeding Ar gas and $N_2$ gas as the sputtering gas, adjusting the flow rate of Ar gas constant at 21 sccm, and continuously varying the flow rate of $N_2$ gas from 26 sccm to 47 sccm. A halftone phase shift film of MoSiN was deposited on the quartz substrate. The film had a composition that was continuously graded in thickness direction, a phase shift of 179° and a transmittance of 6% with respect to light of wavelength 193 nm, and a thickness of 65 nm. In this way, a halftone phase shift mask blank was obtained.

The halftone phase shift film was analyzed for composition by X-ray photoelectron spectroscopy (XPS), finding that the contents of Mo and N continuously decreased, and the content of silicon continuously increased in thickness direction. The film composition on the substrate side was Mo:Si:N=1.4:46.5:52.1 (atomic ratio), and the film composition on the surface side (remote from the substrate) was Mo:Si:N=0.9:52.3:46.8 (atomic ratio). The thickness of a portion having a Mo content in excess of 1.1 at % accounted for 50% of the overall thickness of the halftone phase shift film.

The halftone phase shift film had a surface roughness (RMS) of 0.51 nm as measured under AFM and a sheet resistance of $10^{12}\Omega/\square$. On fluorine base dry etching with $SF_6$ gas and $O_2$ gas, the film had an etching rate of 0.76 nm/sec, which was 1.43 times the etching rate (0.53 nm/sec) of quartz substrate under the same conditions. The fluorine base dry etching was performed in an etching system having two high-frequency power supplies, by assigning reactive ion etching by continuous discharge at 54 W to one power supply and inductively coupled plasma by continuous discharge at 325 W to the other power supply, and feeding $SF_6$ gas at a flow rate of 18 sccm and $O_2$ gas at a flow rate of 45 sccm.

The halftone phase shift film was evaluated for chemical resistance by immersing the film in AMP (30 wt % aqueous ammonia:30 wt % aqueous hydrogen peroxide:deionized water=1:1:200 in volume ratio) for 120 minutes. Chemical resistance was satisfactory as demonstrated by a phase shift change of 0° after chemical treatment (phase shift unchanged). By the standard technique, the halftone phase shift film was processed to form a mask pattern having a line width of 200 nm, yielding a halftone phase shift mask. In air at room temperature (23° C.) and relative humidity 45%, the mask pattern was irradiated with ArF excimer laser pulses to a cumulative dose of 40 kJ/cm², finding that the mask pattern line width experienced a change of 1 nm or less, that is, substantially unchanged. The film was minimized in pattern size variation.

Comparative Example 1

The same sputtering system as in Example 1 was loaded with only a Si target. A quartz substrate of 152 mm squares and 6.35 mm thick was set in the chamber. Sputtering was carried out by applying a power of 1,900 W across the Si target for discharge, feeding Ar gas and N₂ gas as the sputtering gas, adjusting the flow rate of Ar gas constant at 22 sccm, and continuously varying the flow rate of N₂ gas from 23.5 sccm to 44.5 sccm. A halftone phase shift film of SiN was deposited on the quartz substrate. The film had a composition that was continuously graded in thickness direction, a phase shift of 179° and a transmittance of 6% with respect to light of wavelength 193 nm, and a thickness of 64 nm. In this way, a halftone phase shift mask blank was obtained.

The halftone phase shift film had a surface roughness (RMS) of 0.51 nm as measured under AFM and a sheet resistance in excess of the measurement limit: $10^{13}\Omega/\square$. In the etching test as in Example 1, the film had an etching rate of 0.65 nm/sec, which was 1.23 times the etching rate of quartz substrate. In the chemical test as in Example 1, chemical resistance was satisfactory as demonstrated by a phase shift change of 0° after chemical treatment (phase shift unchanged). In the laser irradiation test as in Example 1, the mask pattern line width experienced a change of 1 nm or less, that is, substantially unchanged. The film was minimized in pattern size variation.

Comparative Example 2

The same sputtering system as in Example 1 was loaded with a MoSi target and a Si target. A quartz substrate of 152 mm squares and 6.35 mm thick was set in the chamber. Sputtering was carried out by applying a power of 725 W across the MoSi target and a power of 1,275 W across the Si target for simultaneous discharge, feeding Ar gas, N₂ gas and O₂ gas as the sputtering gas, adjusting the flow rate of Ar gas constant at 8.5 sccm, the flow rate of N₂ gas constant at 65 sccm, and the flow rate of O₂ gas constant at 2.6 sccm. A halftone phase shift film of MoSiON was deposited on the quartz substrate. The film had a composition that was constant in thickness direction, a phase shift of 177° and a transmittance of 6% with respect to light of wavelength 193 nm, and a thickness of 75 nm. In this way, a halftone phase shift mask blank was obtained.

On XPS analysis, the halftone phase shift film had a composition of Mo:Si:N:O=8.7:36.1:45.1:10.1 (atomic ratio). The film had a surface roughness (RMS) of 0.75 nm as measured under AFM. In the laser irradiation test as in Example 1, the mask pattern line width experienced a large change of 26.7 nm. The film was poor in pattern size variation.

Japanese Patent Application No. 2016-190050 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift mask blank comprising a transparent substrate and a halftone phase shift film thereon having a phase shift of 150° to 200° and a transmittance of 3% to 30% with respect to light of wavelength up to 200 nm, wherein said halftone phase shift film is a single layer or a multilayer film, and is composed of a silicon base material comprising essentially a transition metal, silicon and nitrogen and optionally oxygen, said halftone phase shift film includes at least one layer (A) composed of a silicon base material having a transition metal content of up to 3 at %, a total content of silicon, nitrogen and oxygen of at least 90 at %, a silicon content of 30 to 70 at %, a total content of nitrogen and oxygen of 30 to 60 at %, and an oxygen content of up to 30 at %, and having a sheet resistance of up to $10^{13}\Omega/\square$, wherein the transition metal contains molybdenum, and the layer (A) is compositionally graded such that the concentration of some or all constituent elements continuously varies in thickness direction, the contents of transition metal and nitrogen continuously decrease, and the content of silicon continuously increases in thickness direction.

2. The mask blank of claim 1 wherein said halftone phase shift film has a thickness of up to 70 nm.

3. The mask blank of claim 1 wherein said halftone phase shift film has a surface roughness RMS of up to 0.6 nm.

4. The mask blank of claim 1, further comprising a second film on said halftone phase shift film, the second film being a single layer or a multilayer film composed of a chromium-containing material.

5. The mask blank of claim 4 wherein the second film is a light-shielding film, a combination of light-shielding film and antireflective film, or a processing auxiliary film which functions as a hard mask during pattern formation of the halftone phase shift film.

6. The mask blank of claim 4, further comprising a third film on the second film, the third film being a single layer or a multilayer film composed of a silicon-containing material.

7. The mask blank of claim 6 wherein the second film is a light-shielding film, a combination of light-shielding film and antireflective film, or a processing auxiliary film which functions as a hard mask during pattern formation of the halftone phase shift film, and the third film is a processing auxiliary film which functions as a hard mask during pattern formation of the second film.

8. The mask blank of claim 6 wherein the second film is a processing auxiliary film which functions as a hard mask during pattern formation of the halftone phase shift film and as an etch stopper during pattern formation of the third film, and the third film is a light-shielding film or a combination of light-shielding film and antireflective film.

9. The mask blank of claim 6, further comprising a fourth film on the third film, the fourth film being a single layer or a multilayer film composed of a chromium-containing material.

10. The mask blank of claim 9 wherein the second film is a processing auxiliary film which functions as a hard mask during pattern formation of the halftone phase shift film and as an etch stopper during pattern formation of the third film, the third film is a light-shielding film or a combination of light-shielding film and antireflective film, and the fourth film is a processing auxiliary film which functions as a hard mask during pattern formation of the third film.

11. A halftone phase shift mask prepared from the halftone phase shift mask blank of claim 1.

12. The mask blank of claim 1 wherein the contents of transition metal and nitrogen continuously decrease from the substrate side, and the content of silicon continuously increases from the substrate side.

13. The mask blank of claim 1 wherein the total content of silicon, nitrogen and oxygen in the layer (A) is at least 95 at %.

14. The mask blank of claim 1 wherein in said layer (A), a portion having a silicon content of up to 50 at % accounts for at least 10% of the overall thickness of layer (A) and a portion having a total content of nitrogen and oxygen of at least 50 at % accounts for at least 10% of the overall thickness of layer (A).

15. The mask blank of claim 1 wherein the silicon base material of which layer (A) is composed has a transition metal content of at least 0.5 at %.

* * * * *